(12) United States Patent
Shioya et al.

(10) Patent No.: US 6,479,408 B2
(45) Date of Patent: Nov. 12, 2002

(54) SEMICONDUCTOR DEVICE AND METHOD OF MANUFACTURING THE SAME

(75) Inventors: Yoshimi Shioya, Tokyo (JP); Kouichi Ohira, Tokyo (JP); Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 2 days.

(21) Appl. No.: 09/843,725

(22) Filed: Apr. 30, 2001

(65) Prior Publication Data

US 2001/0051445 A1 Dec. 13, 2001

(30) Foreign Application Priority Data

May 18, 2000 (JP) ........................................ 2000-146242

(51) Int. Cl.$^7$ ............................................. H01L 21/31
(52) U.S. Cl. ........................................ 438/789; 438/778
(58) Field of Search ............................... 438/584, 622, 438/623, 687, 689, 758, 778, 780, 789, 790

(56) References Cited

U.S. PATENT DOCUMENTS 5,710,079 A * 1/1998 Sukharev .................... 438/778
6,147,009 A * 11/2000 Grill et al. .................. 438/789
6,340,628 B1 * 1/2002 Van Cleemput et al. .... 438/789

FOREIGN PATENT DOCUMENTS

| EP | 0 881 678 A2 | 5/1998 |
| JP | 11-288931 | 10/1999 |
| WO | 98/50945 | 5/1997 |

* cited by examiner

*Primary Examiner*—Michael Sherry
*Assistant Examiner*—Lisa Kilday
(74) *Attorney, Agent, or Firm*—Lorusso & Loud

(57) ABSTRACT

The present invention relates to a semiconductor device manufacturing method for forming an interlayer insulating film having a low dielectric constant by coating a copper wiring. The semiconductor device manufacturing method comprises the steps of preparing a substrate 21 from a surface of which copper wirings 23 are exposed, and forming an interlayer insulating film having a low dielectric constant on the substrate 21, wherein the interlayer insulating film is formed of a multi-layered insulating film including a insulating film 24 that contacts with the copper wirings 23, and the insulating film 24 is formed by plasmanizing a film forming gas containing an alkyl compound having an Si—O—Si bond and one oxygen-containing gas selected from the group consisting of $N_2O$, $H_2O$, and $CO_2$, whose flow rate is equal to or less than a flow rate of the siloxane, to react mutually.

8 Claims, 9 Drawing Sheets

Film Forming Conditions
    HMDSO Flow Rate: 50 sccm
    $N_2O$ Flow Rate: 30 sccm
    Gas Pressure: 1 Torr
    Substrate Temperature: 350°C
Plasmanizing Conditions
    High Frequency Power: 0 W
    Low Frequency Power: 100 W Film Forming Conditions
  HMDSO Flow Rate: 50 sccm
  $N_2O$ Flow Rate: 30 sccm
  Gas Pressure: 1 Torr
  Substrate Temperature: 350°C
Plasmanizing Conditions
  High Frequency Power: 0 W
  Low Frequency Power: 100 W

SEMICONDUCTOR DEVICE AND METHOD OF MANUFACTURING THE SAME

BACKGROUND OF THE INVENTION

1. Field of the Invention

The present invention relates to a semiconductor device in which an interlayer insulating film having a low dielectric constant is formed to cover a copper wiring, and a method of manufacturing the same.

2. Description of the Prior Art

In recent years, with the progress of the higher integration and the higher density of the semiconductor integrated circuit device, the higher speed of the data transfer rate is requested. For this reason, the insulating film having the low dielectric constant to give the small RC delay (referred to as a "low dielectric constant insulating film" hereinafter) is employed. For example, there are the SiOF film having the relative dielectric constant of 3.5 to 3.8, the porous SiO2 film having the relative dielectric constant of 3.0 to 3.1, etc.

In contrast, the wiring material is being changed from the conventional aluminum (Al) to the copper (Cu) wiring having the low electric resistance.

Accordingly, in order to manufacture the semiconductor device having the conventional multi-layered copper wiring, the low dielectric constant insulating film is formed as the interlayer insulating film on the copper wiring. However, since normally the copper is easily diffused into the low dielectric constant insulating film from the copper wiring, the leakage current between the upper and lower wirings is increased. Therefore, in order to prevent the diffusion of the copper element into the low dielectric constant insulating film, the development of the SiC-based barrier insulating film is carried out at the same time.

The semiconductor device having the copper wirings has a constitution that the SiC-based barrier insulating film and the low dielectric constant insulating film are laminated in sequence on the copper wirings.

However, although its relative dielectric constant is relatively low such as about 5, the SiC-based barrier insulating film cannot sufficiently suppress the increase in the leakage current. In this case, in order to enoughly suppress the leakage current, the oxygen must be introduced much more into the SiC-based barrier insulating film.

If to do so, the leakage current can be reduced up to the satisfactory level, nevertheless such a new problem is caused that the surface of the copper wiring is oxidized and thus the barrier insulating film and the low dielectric constant insulating film is ready to peel.

SUMMARY OF THE INVENTION

It is an object of the present invention to provide a semiconductor device capable of reducing a leakage current between copper wirings which sandwich an interlayer insulating film between them while preventing peeling-off of the interlayer insulating film when the interlayer insulating film made of a multi-layered insulating film having a low dielectric constant is formed between the copper wirings, and a method of manufacturing the same.

The insulating film that comes into contact with the wiring of the multi-layered wiring constituting the interlayer insulating film is formed by plasmanizing the film forming gas containing the alkyl compound having the siloxane bond and any one oxygen-containing gas of $N_2O$, $H_2O$, and $CO_2$, whose flow rate is equal to or less than the flow rate of the alkyl compound gas, to react mutually.

Since the insulating film is formed by the plasma enhanced CVD method using the film forming gas containing the alkyl compound having the siloxane bond or the plasma enhanced CVD method using the alkyl compound having the siloxane bond and the gas containing the hydrocarbon, the dense insulating film having the low dielectric constant can be formed.

Particularly, the film having the high density can be formed by employing the parallel-plate type plasma film forming apparatus, then connecting at least the low frequency power supply to the electrode side that holds the substrate, and then applying the low frequency power to the substrate.

Also, since the gas containing a small amount of oxygen is employed as the oxygen-containing gas serving as the oxidizing agent and also the flow rate of the oxygen-containing gas is set equal to or smaller than the flow rate of the alkyl compound, the oxidation of the copper wiring, a relative amount of oxygen in the film forming gas can be reduced. Therefore, the oxidation of the copper wiring, for example, can be prevented in forming the film. In addition, when the copper wiring is covered with a barrier insulating film and then other interlayer insulating film having the low dielectric constant is formed on the barrier insulating film, the barrier insulating film can prevents the copper wiring from being oxidized even if the oxygen-containing gas is contained in the film forming gas.

Further, the barrier insulating film formed as described above is dense. Thus, if such barrier insulating film is inserted between the upper and lower copper wirings, the leakage current between the copper wirings between which the interlayer insulating film is sandwiched can be reduced by preventing the diffusion of the copper into the interlayer insulating film from the copper wiring, and also the dielectric constant of the overall interlayer insulating film can be reduced.

As described above, according to the present invention, it is possible to form the interlayer insulating film that is dense, and results in the small leakage current between the copper wirings which sandwich the interlayer insulating film, and has the low dielectric constant.

DESCRIPTION OF THE PREFERRED EMBODIMENTS

Embodiments of the present invention will be explained with reference to the accompanying drawings hereinafter.

First Embodiment

Figure 7:
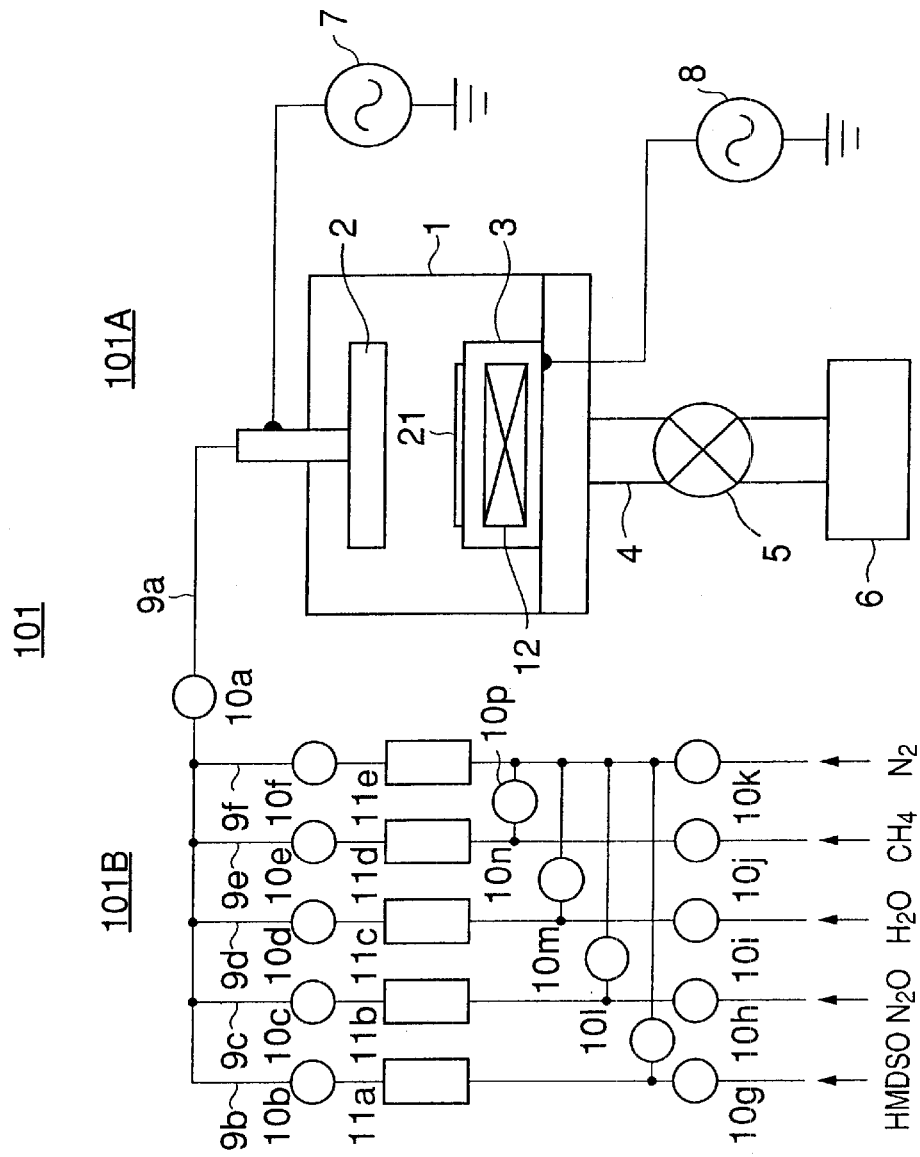
FIG. 7 is a side view showing a configuration of a plasma film forming apparatus employed in a semiconductor device manufacturing method as embodiments of the present invention.

FIG. 7 is a side view showing a configuration of a parallel-plate type plasma film forming apparatus 101 employed in a semiconductor device manufacturing method according to embodiments of the present invention.

This plasma film forming apparatus 101 comprises a film forming portion 101A as a place where a barrier insulating film is formed on a substrate 21 by the plasma gas, and a film forming gas supply portion 101B having a plurality of gas supply sources for supplying gases respectively to construct a film forming gas.

As shown in FIG. 7, the film forming portion 101A includes a chamber 1 whose pressure can be lowered, and the chamber 1 is connected to an exhausting device 6 via exhaust pipings 4. A switching valve 5 that controls communication/non-communication between the chamber 1 and the exhausting device 6 is provided in the middle of the exhaust pipings 4. A pressure measuring means such as a vacuum gauge (not shown), etc. that monitors the pressure in the chamber 1 is provided to the chamber 1.

A pair of opposing upper electrode (first electrode) 2 and lower electrode (second electrode) 3 are provided in the chamber 1. A power supply (RF power supply) 7 for supplying the high frequency power having a frequency 13.56 MHz is connected to the upper electrode 2, and also a power supply (LF power supply) 8 for supplying the low frequency power having a frequency 380 kHz is connected to the lower electrode 3. The film forming gas is plasmanized by supplying the power to the upper electrode 2 and the lower electrode 3 from these power supplies 7, 8. The upper electrode 2, the lower electrode 3, and the power supplies 7, 8 constitute a plasma generating means for plasmanizing the film forming gas.

The upper electrode 2 is used commonly as a distributor of the film forming gas. A plurality of through holes are formed in the upper electrode 2, and then opening portions of the through holes formed on a surface opposing to the lower electrode 3 act as discharge ports (inlet ports) of the film forming gas. The discharge ports for the film forming gas, etc. are connected to the film forming gas supply portion 101B via a piping 9a. Also, as the case may be, a heater (not shown) may be provided to the upper electrode 2. This is because the upper electrode 2 is heated up to the temperature of about 100° C. during the film formation to prevent the particles consisting of the reaction product such as the film forming gas, etc. from sticking onto the upper electrode 2.

The lower electrode 3 is used commonly as a retaining table of a substrate 21, and has a heater 12 for heating the substrate 21 on the retaining table.

Supply sources for hexamethyldisiloxane (HMDSO: $(CH_3)_3Si-O-Si(CH_3)_3$), nitrogen monoxide ($N_2O$), water ($H_2O$), methane ($CH_4$), and nitrogen ($N_2$) are provided to the film forming gas supply portion 101B. These gases are supplied appropriately to the chamber 1 of the film forming portion 101A via branch pipings 9b to 9f and the piping 9a to which all branch pipings 9b to 9f are connected. Flow rate controlling means 11a to 11e and switching means 10b to 10k for controlling the open/close of the branch pipings 9b to 9f are provide in the middle of the branch pipings 9b to 9f, and also a switching means 10a for controlling the open/close of the piping 9a is provided in the middle of the piping 9a. Also, in order to purge the residual gas in the branch pipings 9b to 9f by flowing the $N_2$ gas, switching means 10l to 10p for controlling the communication/non-communication between the branch piping 9f connected to the $N_2$ gas supply source and other branch pipings 9b to 9e respectively are provided. In this case, this $N_2$ gas purges the residual gas in the piping 9a and the chamber 1 in addition to the branch pipings 9b to 9e.

According to the above film forming apparatus 101, there are provided the alkyl compound supply source (HMDSO), the hydrocarbon (CH)-containing gas supply source, and the oxygen-containing gas supply source, and also there is provided plasma generating means 2, 3, 7, 8 for plasmanizing the film forming gas.

As a result, the barrier insulating film containing Si, O, C, H can be formed by the plasma enhanced CVD method. Therefore, as shown in a third embodiment described in the following, the barrier insulating film that has the low dielectric constant and suppresses the diffusion of copper can be formed.

Then, as the plasma generating means, there are a means for generating the plasma by using first and second parallel-plate type electrodes 2, 3, a means for generating the plasma by the ECR (Electron Cyclotron Resonance) method, a means for generating the helicon plasma by radiating the high frequency power from the antenna, etc., for example.

Power supplies 7, 8 for supplying high and low frequency powers respectively are connected to the first and second parallel-plate type electrodes 2, 3 among these plasma generating means. Accordingly, the plasma can be generated by applying these high and low frequency powers to the electrodes 2, 3 respectively. In particular, since the insulating film formed in this manner is dense and contains $CH_3$, it has the low dielectric constant.

Then, concerning to the alkyl compound having a siloxane bond (that is, an Si—O—Si bond) and the gas containing the hydrocarbon as the film forming gas for the barrier insulating film, to which the present invention is applied, followings can be employed as typical examples.

(i) the alkyl compound having the siloxane bond: hexamethyldisiloxane (HMDSO: $(CH_3)_3Si-O-Si(CH_3)_3$) octamethylcyclotetrasiloxane (OMCTS:

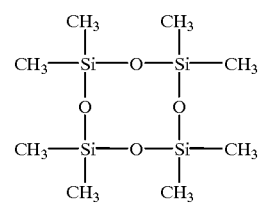

(ii) the gas containing the hydrocarbon:
methane ($CH_4$)
ethylene ($C_2H_4$)
ethane ($C_2H_6$)

Figure 8A:
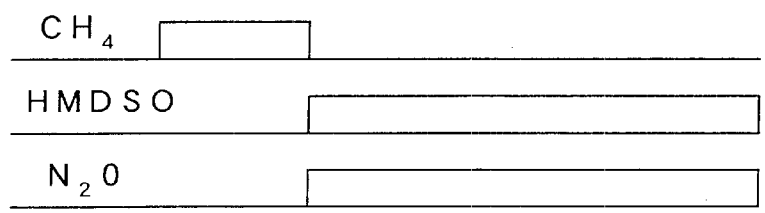
FIG. 8A is a timing chart showing the introduction timing of film forming gases, that are employed in the semiconductor device manufacturing method as the first embodiment of the present invention, into the chamber of the plasma film forming apparatus.

Next, a semiconductor device and a method of manufacturing the same according to the first embodiment of the present invention will be explained with reference to FIG. 1, FIG. 7, and FIG. 8A hereinafter.

FIGS. 1A to 1F are sectional views showing the semiconductor device and the method of manufacturing the same according to the first embodiment of the present invention. HMDSO+$N_2O$ is employed as the film forming gas, and timings of the introduction of respective gases constituting the employed film forming gas are shown in FIG. 8A.

Figure 1A:
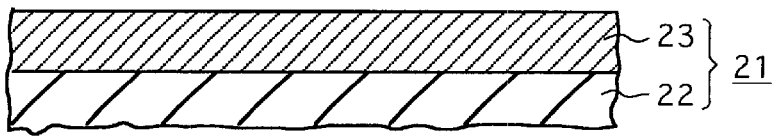
FIGS. 1A to 1F are sectional views showing a semiconductor device and a method of manufacturing the same according to a first embodiment of the present invention.

FIG. 1A is a sectional view showing the state after the copper wiring is formed. In FIG. 1A, a reference 22 denotes an underlying insulating film, and a reference 23 denotes a copper wiring (lower wiring) formed by the plating. Although not shown, a TaN film as a copper barrier against the underlying insulating film 22 and a Cu film formed by the sputter are formed from the bottom in sequence between the underlying insulating film 22 and the copper wiring (lower wiring) 23. These films constitute a substrate 21.

Figure 1B:
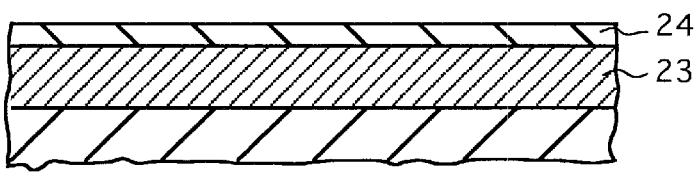

Then, as shown in FIG. 1B, in this state, a barrier insulating film 24 is formed on the copper wiring 23 by the plasma enhanced CVD method. In order to form the barrier insulating film 24, first the substrate 21 is introduced into the chamber 1 of the plasma film forming apparatus 101 and then held into a substrate holder 3. Then, the hexamethyldisiloxane (HMDSO) and the $N_2O$ gas are introduced into the chamber 1 of the plasma film forming apparatus 101 shown in FIG. 6 at flow rates of 50 sccm and 30 sccm respectively, and the pressure is maintained at 1 Torr. Then, a power 100 W having a frequency of 380 kHz is applied to the lower electrode 3. No power is applied to the upper electrode 2.

Accordingly, the hexamethyldisiloxane and the $N_2O$ are plasmanized. The barrier insulating film 24 made of an insulating film having a thickness of about 50 nm and containing Si, O, C, H is formed by holding this state for a predetermined time. According to the examination, the formed insulating film containing Si, O, C, H has a relative dielectric constant of about 3.2 when it is measured at the frequency of 1 MHz, and a leakage current of $10^{-8}$ A/cm$^2$ when the electric field strength of 5 MV/cm is applied.

Figure 1C:
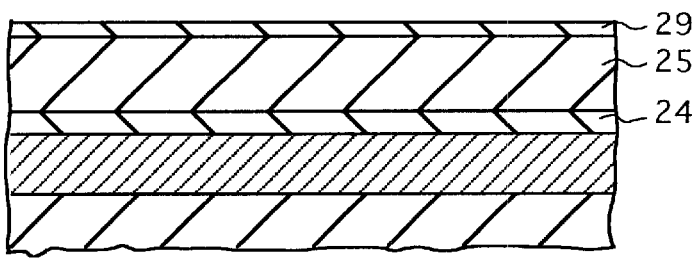

Then, as shown in FIG. 1C, a silicon containing porous insulating film 25 having the low dielectric constant and having a thickness of about 500 nm is formed by the well-known plasma enhanced CVD method. As the method of forming the silicon containing porous insulating film 25, for example, there are the method of forming the multilayered insulating film by repeating the film formation by the low pressure thermal CVD method and the film formation by the plasma enhanced CVD method, the method of laminating the organic film and the $SiO_2$ film alternatively and then removing the organic by the ashing using the oxygen plasma, etc.

Then, a thin and highly dense NSG film (silicon oxide film not containing the impurity) or an SiOC containing insulating film is formed as a protection film 29 for protecting the silicon containing porous insulating film 25 against the ashing and the etching. If the protection film 29 is not formed, there is such a possibility that the silicon containing porous insulating film 25 is altered in quality by the processing gas when a photoresist film 26 is ashed or the barrier insulating film 24 formed under the silicon containing porous insulating film 25 is etched, and thus the low dielectric constant characteristic is degraded. In this case, the protection film 29 may be omitted as the case may be.

Figure 1D:
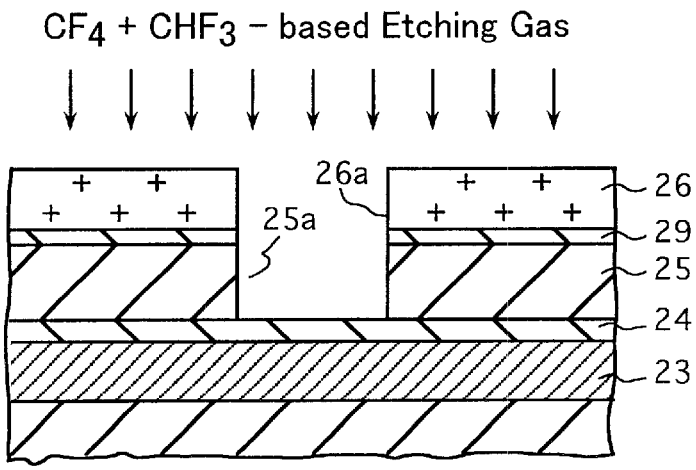

Then, as shown in FIG. 1D, the photoresist film 26 is formed, and then an opening portion 26a is formed in the photoresist film 26 in the via-hole forming area by patterning the photoresist film 26. Then, the interlayer insulating film 25 is etched via the opening portion 26a in the photoresist film 26 by the reactive ion etching (RIE) using the plasmanized $CF_4$+$CHF_3$-based mixed gas to be removed. Accordingly, an opening portion 25a is formed to expose the barrier insulating film 24. Then, the photoresist film 26 is ashed. At this time, the barrier insulating film 24 has the etching resistance against the etching gas and the ashing gas for the above interlayer insulating film 25. As a result, the copper wiring is not badly affected by the etching gas. The concentration of the $CF_4$+$CHF_3$-based mixed gas may be adjusted by adding Ar+$O_2$, etc. to $CF_4$+$CHF_3$.

Figure 1E:
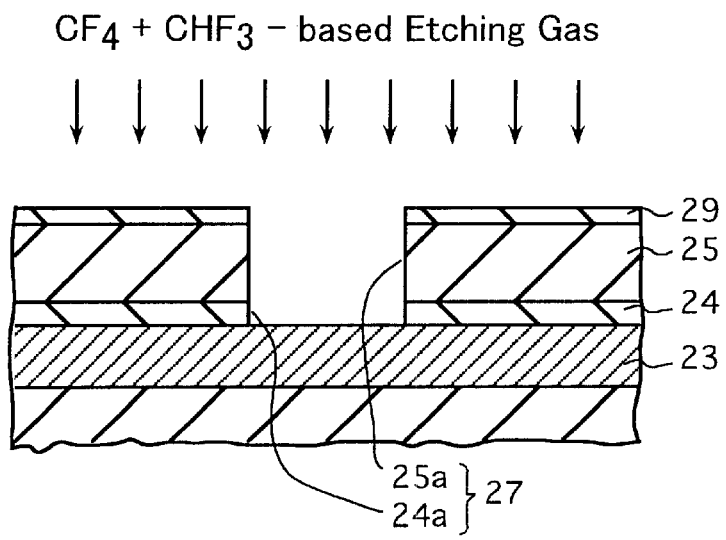

Then, as shown in FIG. 1E, the barrier insulating film 24 is etched via the opening portion in the protection film 29 and the opening portion 25a in the interlayer insulating film 25 by the reactive ion etching (RIE) to be removed. As a gas for the reactive ion etching is used a plasmanized gas of both the gas employed in etching the interlayer insulating film 25 and the $CF_4$+$CHF_3$-based mixed gas changed in composition ratio thereof. Accordingly, a via hole 27 is formed to expose the copper wiring 23 on its bottom. At this time, the copper wiring 23 has the etching resistance against the etching gas for the above barrier insulating film 24. As a result, the copper wiring 23 is not badly influenced by the etching gas. In this case, a surface of the copper wiring is oxidized, but such oxidized surface of the copper wiring may be removed by exposing to the reducing gas, e.g., the $NH_3$ gas, or the hydrogen plasma which is diluted by the inert gas such as argon, nitrogen, or the like, after the etching step of the barrier film via the ashing step of the resist film. Then, the photoresist film 26 is removed.

Figure 1F:
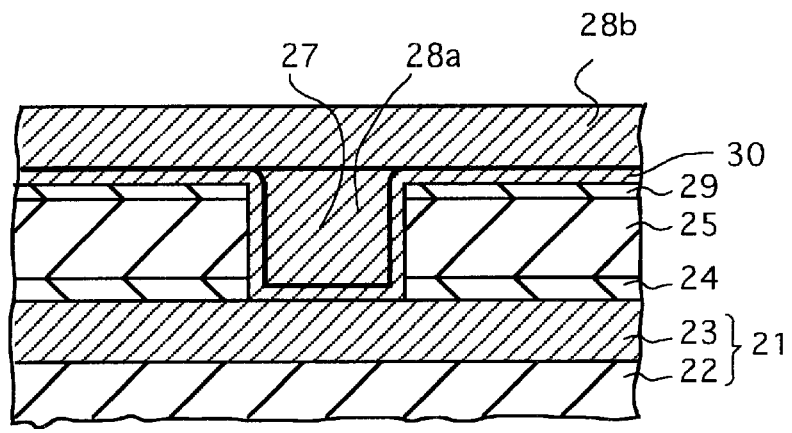

Then, as shown in FIG. 1F, a conductive film, e.g., an underlying conductive film 30 consisting of a barrier metal film such as tantalum nitride (TaN), or the like and a copper film formed by the sputter method is provided in the via hole 27. Then, a copper film 28a is buried on the underlying conductive film 30 and in the via hole 27. Then, an upper wiring 28b made of copper or aluminum is formed to be connected to the underlying wiring 23 via the copper film 28a.

With the above, the formation of the upper wiring 28b can be completed. The upper wiring 28b is connected to the underlying wiring 23 through the via hole 27 formed in both the interlayer insulating film 25 and the barrier insulating film 24.

Next, the examination results of characteristics of the barrier insulating film formed according to the first embodiment of the present invention will be explained hereunder.

Figure 2:
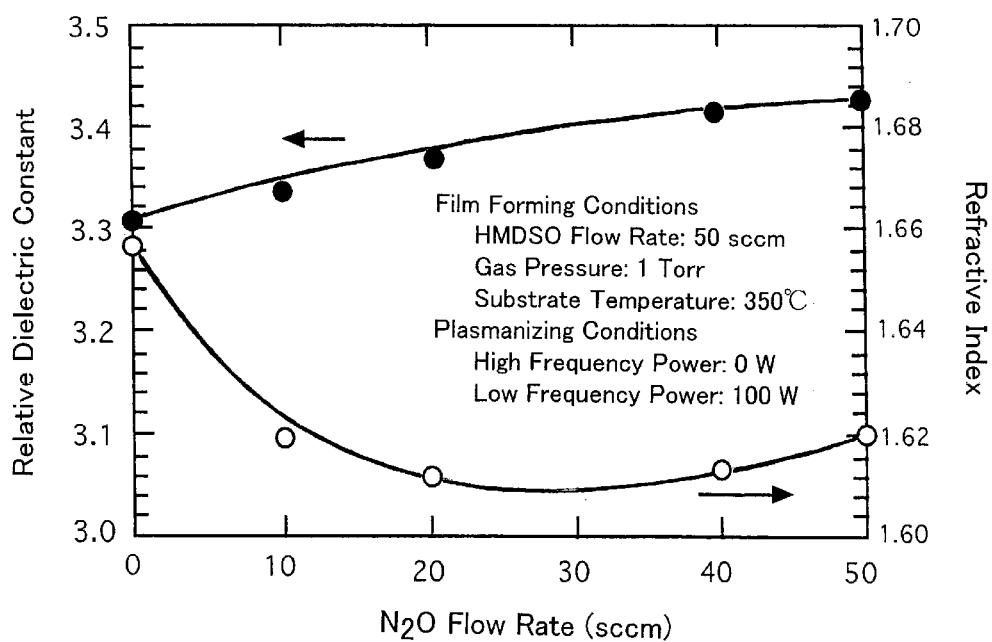
FIG. 2 is a graph showing characteristics of a relative dielectric constant and a refractive index of a barrier insulating film as the first embodiment of the present invention.
Figure 3:
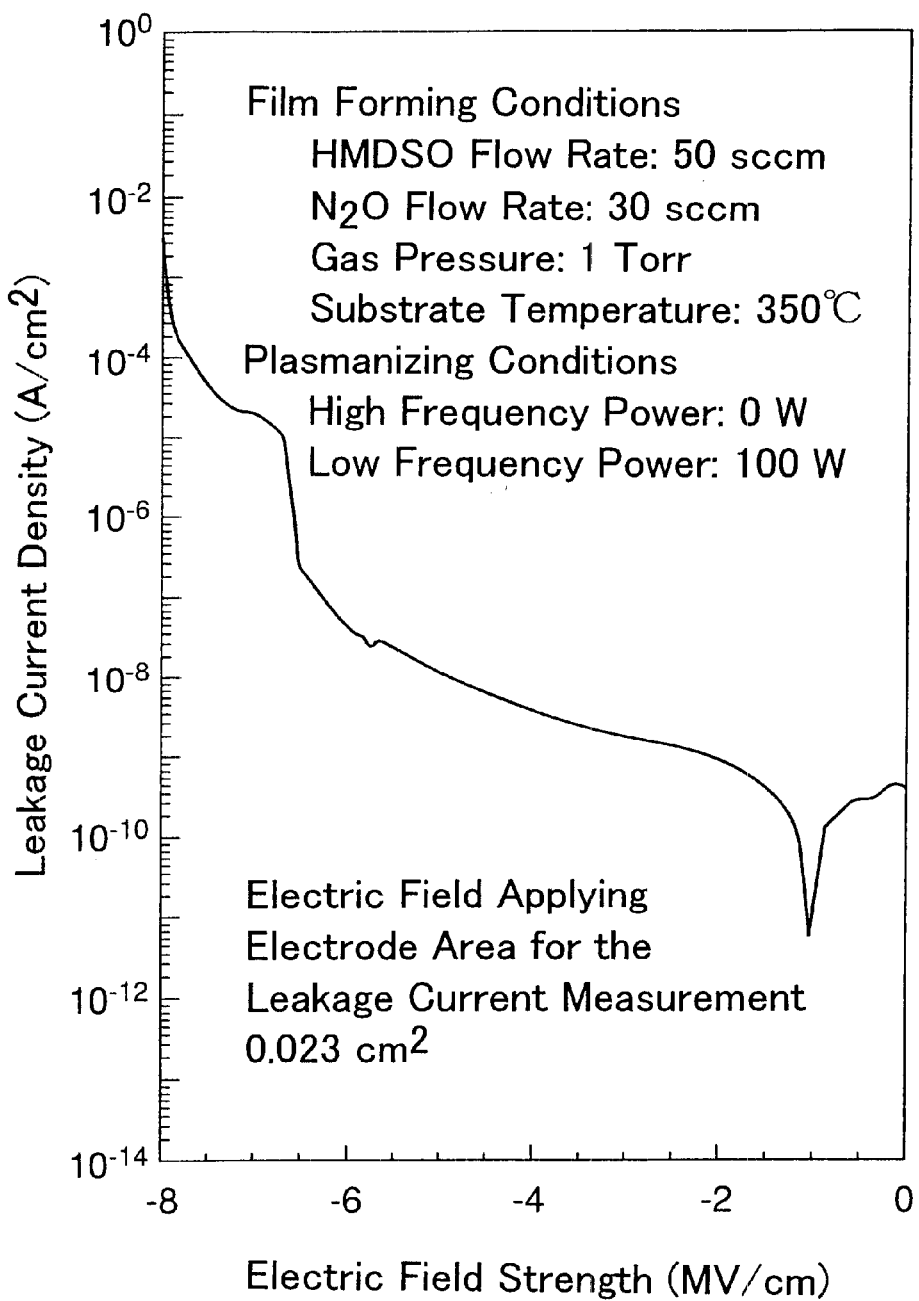
FIG. 3 is a graph showing a characteristic of a leakage current of the barrier insulating film as the first embodiment of the present invention.
Figure 6:
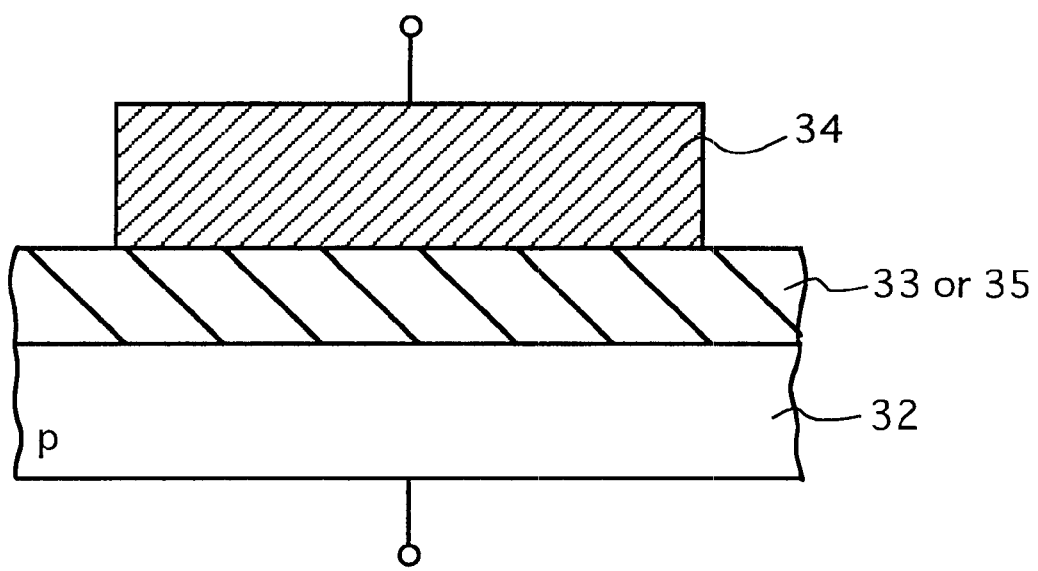
FIG. 6 is a sectional view showing a structure of a sample employed in the characteristic examination of the barrier insulating films as the embodiments of the present invention.

FIG. 2 and FIG. 3 are graphs showing the examination results of the characteristics of the barrier insulating film formed by the semiconductor device manufacturing method according to the first embodiment of the present invention. FIG. 6 is a sectional view showing a structure of a sample employed in the above examination.

The sample employed in this examination is formed as follows. That is, as shown in FIG. 6, a barrier insulating film 33 made of an SiOCH film is formed on a p-type silicon substrate 32 by the plasma enhanced CVD method using HMDSO and $N_2O$ as the film forming gas. Film forming conditions of the barrier insulating film 33 will be given in the following. A film thickness of the barrier insulating film 33 was 472.2 nm.

(i) Film forming conditions
  film forming gas (flow rate): HMDSO (50 sccm)+$N_2O$ (x sccm)
  gas pressure: 1 Torr
  substrate heating temperature: 350° C.

The above $N_2O$ gas flow rate (x sccm) was changed in the range of 0 to 50 sccm.

(ii) plasmanizing conditions
  high frequency power (13.56 MHz) $P_{HF}$: 0 W
  low frequency power (380 kHz) $P_{LF}$: 100 W In addition, a mercury probe 34 that has an electrode area of 0.0230 $cm^2$, which contacts to the barrier insulating film 33, is brought into contact with the surface of the barrier insulating film 33.

The C–V measuring method in which the high frequency signal of 1 MHz is superposed on the DC bias is employed when a relative dielectric constant is measured, and the He—Ne laser whose wavelength is 6338 in the ellipsometer is employed when a refractive index is measured. Also, when the leakage current is measured, the silicon substrate 32 is grounded and the negative voltage is applied to the mercury probe 34.

The measured results of the relative dielectric constant and the refractive index of the barrier insulating film are shown in FIG. 2. In FIG. 2, a left side ordinate denotes the relative dielectric constant represented in a linear scale, and a right side ordinate denotes the refractive index represented in a linear scale. An abscissa denotes the $N_2O$ flow rate (sccm) represented in a linear scale. As shown in FIG. 2, the relative dielectric constant is about 3.3 when the $N_2O$ flow rate is 0 sccm and about 3.41 when the $N_2O$ flow rate is 50 sccm, and is increased with the increase of the $N_2O$ flow rate. Also, the refractive index is about 1.658 when the $N_2O$ flow rate is 0 sccm, and is subsequently decreased with the increase of the $N_2O$ flow rate, and has the minimum value of about 1.605 when the $N_2O$ flow rate is 30 sccm. Then, the refractive index is increased in compliance with the increase of the $N_2O$ flow rate, and becomes about 1.615 at the $N_2O$ flow rate of 50 sccm.

The measured result of the leakage current of the barrier insulating film is shown in FIG. 3. In FIG. 3, an ordinate denotes the leakage current density (A/$cm^2$) represented in a logarithmic scale, and an abscissa denotes an electric field strength (MV/cm) that is applied to the barrier insulating film 33 and represented in a linear scale. In this case, a negative sign of the abscissa indicates that the negative potential is applied to the mercury probe 34.

As shown in FIG. 3, the resultant leakage current is in the order of $10^{-9}$ A/$cm^2$ at the electric field strength of 3 MV/cm. It is preferable that the leakage current should be suppressed lower than $10^{-3}$ A/$cm^2$ at the electric field strength of 3 MV/cm in practical use.

As described above, according to the first embodiment of the present invention, the barrier insulating film 24 containing silicon (Si), oxygen (O), carbon (C), and hydrogen (H) is formed between the lower wiring 23 and the interlayer insulating film 25 by plasmanizing the silicon compound containing only Si, O, C, H as the film forming gas to react.

Since the silicon compound containing silicon (Si), oxygen (O), carbon (C), and hydrogen (H) is employed and the oxidizing agent containing a small amount of oxygen is employed, the oxidation of the underlying wiring 23 caused when the barrier insulating film 24 is formed can be suppressed. Also, since the underlying wiring 23 has already been covered with the barrier insulating film 24 when the interlayer insulating film 25 is formed, the oxidation of the underlying wiring 23 can be prevented even if the oxygen-containing gas is employed.

In the meanwhile, normally the interlayer insulating film 25 having the low dielectric constant is porous, and thus the copper element is ready to diffuse from the outside. However, if the barrier insulating film 24 is formed between the underlying wiring 23 and the porous interlayer insulating film 25, the entering of the copper element from the copper wiring 23 into the porous interlayer insulating film 25 is blocked by the barrier insulating film 24. As a result, since the diffusion of the copper can be prevented by forming the barrier insulating film 24 between them, the leakage current between the wirings 23, 28b that sandwich the porous interlayer insulating film 25 between them can be reduced and also the dielectric constant of the overall interlayer insulating film 25 including the barrier insulating film 24 can be reduced.

For example, the film having the high density can be formed by employing the parallel-plate type plasma film forming apparatus, then connecting the low frequency AC power supply 8 and the high frequency RF power supply 7 to the lower electrode 3 and the upper electrode 2 respectively, and then setting the applied low frequency power higher than the applied high frequency power.

In the above, HMDSO is employed as the silicon compound containing only silicon (Si), oxygen (O), carbon (C), and hydrogen (H). But the other silicon compound mentioned above, e.g., octamethylcyclotetrasiloxane (OMCTS) may be employed.

Also, $N_2O$ is employed as the oxygen-containing gas. But the water ($H_2O$) or the carbon dioxide ($CO_2$) may be employed.

Second Embodiment

Figure 4A:
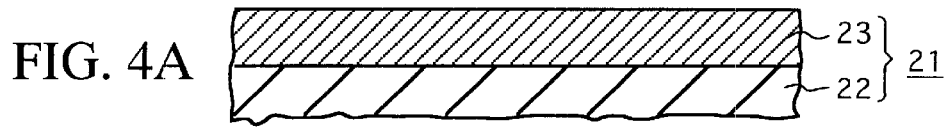
FIGS. 4A and 4B are sectional views showing a semiconductor device and a method of manufacturing the same according to a second embodiment of the present invention.
Figure 4B:
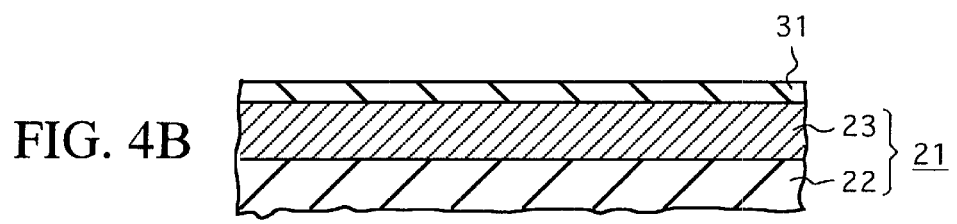

FIGS. 4A and 4B are sectional views showing a semiconductor device and a method of manufacturing the same according to a second embodiment of the present invention.

A difference from the first embodiment of the present invention shown in FIG. 1 is to employ the film forming gas adding the gas containing the hydrocarbon to the above silicon compound and $N_2O$. In addition, other differences reside in that the low frequency power is applied to the lower electrode 3, that holds the substrate, out of the parallel-plate type opposing electrodes, and that the high frequency RF power is also applied to the upper electrode 2 that opposes to the lower electrode 3.

Figure 8B:
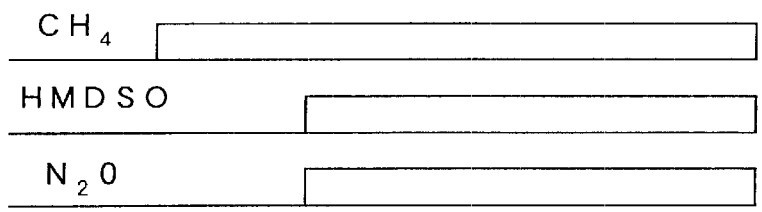
FIG. 8B is a timing chart showing the introduction timing of film forming gases, that are employed in the semiconductor device manufacturing method as the second embodiment of the present invention, into the chamber of the plasma film forming apparatus.

HMDSO+$N_2O$+$CH_4$ are employed as the film forming gas, and timings of the introduction of respective gases constituting the film forming gas into the chamber 1 are shown in FIG. 8B.

First, as shown in FIG. 4A, the copper wiring 23 is formed on the underlying insulating film 22. Then, HMDSO, the $N_2O$ gas, and the $CH_4$ gas as the gas containing the hydrocarbon are introduced into the chamber 1 of the plasma film forming apparatus 101 shown in FIG. 7, and then the barrier insulating film is formed on the copper wiring 23 by the plasma enhanced CVD method. This state is shown in FIG. 4B.

More particularly, HMDSO, the $N_2O$ gas, and the $CH_4$ gas are introduced into the chamber 1 of the plasma film forming apparatus 101 shown in FIG. 7 at the flow rates of 50 sccm, 30 sccm and 50 sccm respectively, and then the gas pressure in the chamber 1 can be maintained at 1 Torr. Then, the AC power 100 W having the frequency of 380 kHz is applied to the lower electrode 3, that holds the substrate, out of the parallel-plate type opposing electrodes, and also the high frequency RF power 50 W having the frequency of 13.54 MHz is applied to the upper electrode 2 that opposes to the lower electrode 3. Accordingly, since the film forming gas is plasmanized, a barrier insulating film 31a is formed by holding this state for 5 seconds to cover the copper wiring 23.

Next, examination results of characteristics of the barrier insulating film formed by the second embodiment of the present invention will be explained with reference to FIG. 5 hereunder.

Figure 5:
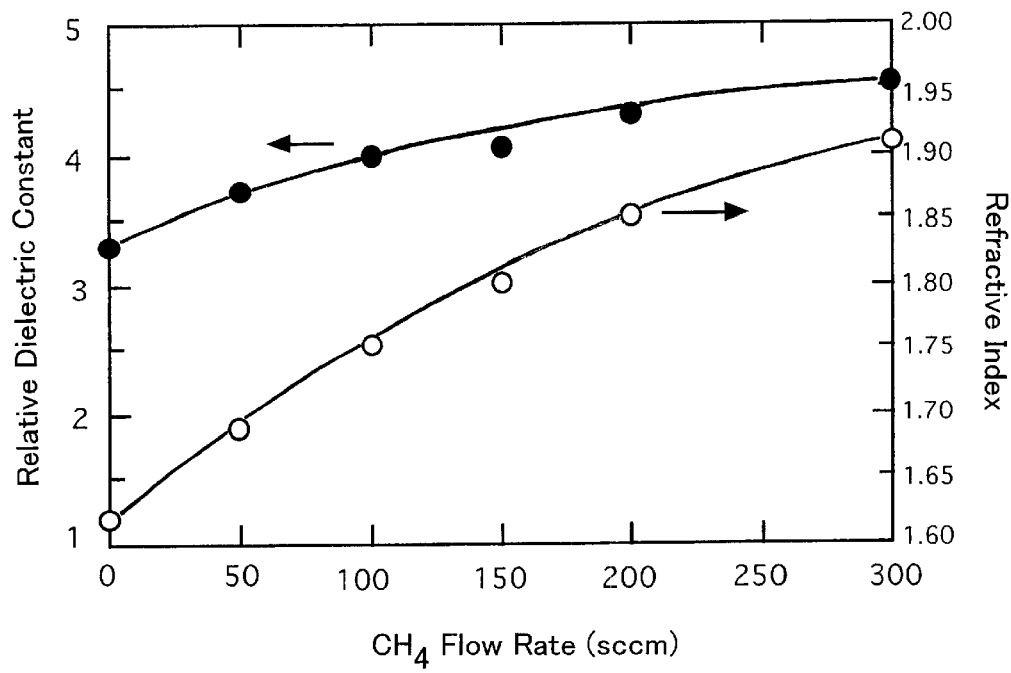
FIG. 5 is a graph showing characteristics of a relative dielectric constant and a refractive index of a barrier insulating film as the second embodiment of the present invention.

FIG. 5 is a graph showing examination results of characteristics of the barrier insulating film formed by the semiconductor device manufacturing method according to the second embodiment of the present invention.

FIG. 6 is a sectional view showing a structure of a sample employed in the above examination. The sample employed in this examination is formed as follows. That is, as shown in FIG. 6, a barrier insulating film 35 made of the SiOCH film is formed on the p-type silicon substrate 32 by the plasma enhanced CVD method using HMDSO and $N_2O$ as the film forming gas. Film forming conditions of the barrier insulating film 35 will be given in the following.

(i) Film forming conditions
    film forming gas (flow rate): HMDSO (50 sccm)+$N_2O$ (30 sccm)+$CH_4$ (y sccm)
    gas pressure: 1 Torr
    substrate temperature: 350° C.

The above $CH_4$ gas flow rate (y sccm) was changed in the range of 0 to 300 sccm.

(ii) Plasmanizing conditions
    high frequency power (13.56 MHz) $P_{HF}$: 0 W
    low frequency power (380 kHz) $P_{LF}$: 100 W In addition, the mercury probe 34 that has an electrode area of 0.0230 $cm^2$, which contacts to the barrier insulating film 35, is brought into contact with the surface of the barrier insulating film 35.

The measurement of the relative dielectric constant and the refractive index is conducted in the same way as the first embodiment.

The measured results of the relative dielectric constant and the refractive index of the barrier insulating film are shown in FIG. 5. In FIG. 5, a left side ordinate denotes the relative dielectric constant represented in a linear scale, and a right side ordinate denotes the refractive index represented in a linear scale. An abscissa denotes the $CH_4$ flow rate (cc/min, sccm) represented in a linear scale. As shown in FIG. 5, the relative dielectric constant is about 3.6 when the $CH_4$ flow rate is 0 sccm, and is subsequently increased with the increase of the $CH_4$ flow rate, and is about 4.5 when the $CH_4$ flow rate is 300 sccm. Also, the refractive index has the same tendency, and is about 1.64 when the $CH_4$ flow rate is 0 sccm, and is about 1.94 when the $CH_4$ flow rate is 300 sccm.

Also, according to another examination, the leakage current is in the order of $10^{-8}$ $A/cm^2$ at the applied electric field strength of 5 MV/cm.

As described above, according to the second embodiment of the present invention, unlike the first embodiment, the film forming gas in which $CH_4$ as the gas containing the hydrocarbon is added to the silicon compound and $N_2O$ is employed. In addition, the low frequency power is applied to the lower electrode 3, that holds the substrate, out of the parallel-plate type opposing electrodes, and that the high frequency power is also applied to the upper electrode 2 that opposes to the lower electrode 3. Accordingly, since the dense insulating film having the low dielectric constant can be formed, the dielectric constant of the overall interlayer insulating film 25 including the barrier insulating film 31 can be reduced and also the leakage current can be reduced by preventing more completely the diffusion of the copper.

Also, $N_2O$ is employed as the oxygen-containing gas out of the film forming gas for the barrier insulating film 31a that contacts to the copper wiring 23, and its flow rate is reduced in contrast to the flow rate of the alkyl compound. As a result, since an amount of contained oxygen in the film forming gas is reduced, the oxidation of the surface of the copper wiring 23 can be suppressed and also the diffusion of the copper can be prevented.

In the above, the methane ($CH_4$) is employed as the gas containing the hydrocarbon. But ethylene ($C_2H_4$) or ethane ($C_2H_6$) may be employed.

As described above, according to the present invention, the insulating film that comes into contact with the wiring of the multi-layered wiring constituting the interlayer insulating film is formed by plasmanizing the film forming gas containing the alkyl compound having the siloxane bond and any one oxygen-containing gas of $N_2O$, $H_2O$, and $CO_2$, whose flow rate is equal to or less than the flow rate of the alkyl compound gas, to react mutually.

Since the insulating film is formed by the plasma enhanced CVD method using the film forming gas containing the alkyl compound having the siloxane bond or the plasma enhanced CVD method using the alkyl compound having the siloxane bond and the gas containing the hydrocarbon, the insulating film having the low dielectric constant can be formed.

Also, since the gas containing a small amount of oxygen is employed as the oxygen-containing gas serving as the oxidizing agent, and the gas flow rate is reduced smaller than the flow rate of the alkyl compound, the oxidation of the copper wiring, for example, can be prevented in forming the film.

In addition, since the barrier insulating film is inserted between the upper and lower copper wirings, the diffusion of the copper into the interlayer insulating film from the copper wiring can be reduced and also the dielectric constant of the overall interlayer insulating film can be reduced.

As described above, according to the present invention, the dense interlayer insulating film having the small leakage current and the low dielectric constant can be formed.

With the above, the present invention is explained in detail based on the embodiments. But the scope of the present invention is not limited to the examples shown particularly in the above embodiments, and modifications of the above embodiment without departing from the gist of the present invention may be contained in the scope of the invention.

What is claimed is:

1. A semiconductor device manufacturing method comprising the steps of:
    preparing a substrate from a surface of which copper wirings are exposed; and
    forming an interlayer insulating film having a low dielectric constant on the substrate;
    wherein the interlayer insulating film is formed of a multi-layered insulating film including a insulating film that contacts the copper wirings, and the insulating film that contacts with the copper wirings is formed by reaction of a plasma of a film-formimg gas containing an alkyl compound having an Si—O—Si bond and one oxygen-containing gas selected from the group consisting of $N_2O$, $H_2O$, and $CO_2$, whose flow rate is equal to or less than a flow rate of the siloxane.

2. A semiconductor device manufacturing method according to claim 1, wherein the film forming gas contains a gas containing hydrocarbon in addition to the alkyl compound and the oxygen-containing gas.

3. A semiconductor device manufacturing method according to claim 2, wherein the gas containing hydrocarbon is one selected from the group consisting of methane ($CH_4$), ethylene ($C_2H_4$), and ethane ($C_2H_6$).

4. A semiconductor device manufacturing method according to claim 1, wherein the alkyl compound having the Si—O—Si bond is one selected from the group consisting of (i) hexamethyldisiloxane (HMDSO: $(CH_3)_3$Si—O—Si$(CH_3)_3$), and (ii) octamethylcyclotetrasiloxane (OMCTS:

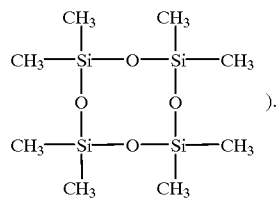

).

5. A semiconductor device manufacturing method according to claim 1, wherein parallel-plate type electrodes are employed as a plasma generating means, and an AC power of a frequency of 100 kHz to 1 MHz is applied to an electrode, that holds the substrate, in forming the film.

6. A semiconductor device manufacturing method according to claim 5, wherein an interval between the electrodes is set to more than a thickness of the substrate and less than 25 mm.

7. A semiconductor device manufacturing method according to claim 1, wherein parallel-plate type electrodes are employed as a plasma generating means, and an AC power of a frequency of more than 1 MHz is applied to an electrode, that opposes to the electrode that holds the substrate, in forming the film.

8. A semiconductor device manufacturing method according to claim 7, wherein an interval between the electrodes is set to more than a thickness of the substrate and less than 25 mm.

* * * * *